(12) United States Patent
Oshima

(10) Patent No.: US 7,589,345 B2
(45) Date of Patent: Sep. 15, 2009

(54) NITRIDE-BASED COMPOUND SEMICONDUCTOR SUBSTRATE AND METHOD FOR FABRICATING THE SAME

(75) Inventor: Yuichi Oshima, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/330,393

(22) Filed: Jan. 12, 2006

(65) Prior Publication Data

US 2006/0170000 A1  Aug. 3, 2006

(51) Int. Cl.
*H01L 31/00* (2006.01)
(52) U.S. Cl. .......................... 257/12; 257/13; 257/103; 257/183; 257/E33.028; 257/E33.033; 257/E33.034
(58) Field of Classification Search ................. 257/613, 257/627, 628
See application file for complete search history.

(56) References Cited

U.S. PATENT DOCUMENTS

| | | | | |
|---|---|---|---|---|
| 6,218,269 | B1 * | 4/2001 | Nikolaev et al. | 438/518 |
| 6,924,159 | B2 | 8/2005 | Usui et al. | |
| 2002/0053665 | A1 * | 5/2002 | Tsuda et al. | 257/14 |
| 2002/0137248 | A1 * | 9/2002 | Ogawa et al. | 438/29 |
| 2002/0149028 | A1 * | 10/2002 | Hori et al. | 257/102 |
| 2003/0143771 | A1 * | 7/2003 | Kidoguchi et al. | 438/46 |
| 2003/0183158 | A1 * | 10/2003 | Maruska et al. | 117/84 |
| 2004/0041156 | A1 * | 3/2004 | Tsuda et al. | 257/79 |
| 2006/0027896 | A1 * | 2/2006 | Fujiwara et al. | 257/615 |

FOREIGN PATENT DOCUMENTS

| | | | |
|---|---|---|---|
| JP | WO 02/065556 | * | 8/2002 |
| JP | 2003-178984 | | 6/2003 |

* cited by examiner

*Primary Examiner*—Sue Purvis
*Assistant Examiner*—Leslie Pilar Cruz
(74) *Attorney, Agent, or Firm*—McGinn IP Law Group, PLLC

(57) ABSTRACT

A nitride-based compound semiconductor substrate mainly used for an epitaxial growth of a nitride semiconductor and a method for fabricating the same are disclosed. The nitride-based compound semiconductor substrate has a composition of $Al_xGa_{1-x}N$ (0<x<1), a principal plane of C face, an area of 2 cm$^2$ or more, and a thickness of 200 μm or more. The substrate having this structure is fabricated by a HVPE (hydride vapor phase epitaxy) method by using an organic Al compound such as TMA (trimethyl aluminum) or TEA (trimethyl aluminum) as an Al source, A stable crystal growth can be obtained without damaging a reacting furnace, and a large-sized AlGaN crystal substrate with an excellent crystallinity can be obtained.

1 Claim, 3 Drawing Sheets

3 5 ' AlGaN SELF-STANDING SUBSTRATE 2 2 GaN LAYER
2 1 SAPPHIRE SUBSTRATE 2 3 SiO₂ FILM
2 2
2 1

PHOTOLITHOGRAPHY PROCESS 2 3 a WINDOW
2 3' SiO₂ MASK
2 2
2 1

2 4 AlGaN THICK FILM
2 3'
2 2
2 1

NITRIDE-BASED COMPOUND SEMICONDUCTOR SUBSTRATE AND METHOD FOR FABRICATING THE SAME

The present application is based on Japanese Patent Application No. 2004-005314 filed on Jan. 13, 2004, the entire contents of which are incorporated herein by reference.

BACKGROUND OF THE INVENTION

1. Field of the Invention

The present invention relates to a nitride-based compound semiconductor substrate and a method for fabricating the same.

2. Description of the Related Art

A nitride-based compound semiconductor such as GaN has been remarked as a material for a ultraviolet light emitting diode and a blue light emitting diode, since the nitride-based compound semiconductor is one of direct transition semiconductors and has a large bandgap.

As a substrate for fabricating a nitride-based compound semiconductor light emitting diode, a foreign substrate such as sapphire substrate has been used. However, there are disadvantages in that a high-density dislocation occurs in accordance with a heteroepitaxial growth and that a manufacturing process of the light emitting diode is complicated.

For solving the above problems, a nitride-based compound semiconductor self-standing substrate has been actively developed and researched. As a representative example of the nitride-based compound semiconductor self-standing substrate, Japanese Patent Laid-Open No. 2003-178984 (JP-A-2003-178984) discloses a method for fabricating a GaN self-standing substrate by forming a thick GaN layer on a foreign substrate such as sapphire substrate by using a HVPE method (Hydride Vapor Phase Epitaxy), and removing the foreign substrate after formation of the GaN layer. In this method, a layer having a void functions as a strain reducing layer (strain relaxation layer), which relaxes a strain due to a difference in lattice constants or difference in thermal expansion coefficients between a backing substrate and a group III nitride-based compound semiconductor. According to this structure, it is assumed that the group III nitride-based compound semiconductor substrate with a low defect density and an excellent crystallinity without warping can be obtained. According to this technique, a GaN substrate with a low dislocation is now realizing and begins to appear in the market.

However, when fabricating an ultraviolet light emitting diode from the nitride-based compound semiconductor, there are disadvantages in that the GaN substrate absorbs the ultraviolet light and that a brightness of the light emitting diode falls. So as to prevent these problems, it is effective to provide a substrate made of a ternary mixed crystal that is expressed as $Al_xGa_{1-x}N$ (0<x<1), since the bandgap can be increased by using Al.

However, an AlGaN crystal having a sufficient area and thickness as a substrate for epitaxial growth does not exist till now. The main reason is that an aluminum chloride generated in the growth reacts so intensely with a quartz reacting furnace.

SUMMARY OF THE INVENTION

Accordingly, it is an object of the invention to provide a large-sized AlGaN crystal substrate having an excellent crystallinity, by which a stable crystal growth can be realized without damaging a reacting furnace, so as to solve the above problems.

Considering with the above circumstances, according to the present invention, organic Al compound such as TMA (trimethyl aluminum) or TEA (triethyl aluminum) is used as a source (raw material) of Al instead of the aluminum chloride. Therefore, the stable crystal growth can be realized without damaging the reacting furnace, so that the large-sized AlGaN crystal substrate can be provided.

According to a first feature of the invention, a nitride-based compound semiconductor substrate, comprises:

an $Al_xGa_{1-x}N$ (0<x<1) crystal layer having a principal plane of C face, an area of 2 cm$^2$ or more, and a thickness of 200 μm or more.

According to a second feature of the invention, in the nitride-based compound semiconductor substrate, a half bandwidth of a X-ray rocking curve on a (0002) reflection is 300 seconds or less.

According to a third feature of the invention, in the nitride-based compound semiconductor substrate, a variation in an Al composition is within a range of plus or minus 20% of a center value in a plane.

According to a fourth feature of the invention, a nitride-based compound semiconductor substrate, comprises:

an $Al_xGa_{1-x}N$ (0<x<1) crystal layer on which a light emitting diode of a nitride-based compound semiconductor is fabricated, wherein a source of Al is an organic Al compound.

According to a fifth feature of the invention, a method for fabricating a nitride-based compound semiconductor substrate, comprises steps of:

providing a foreign substrate; and forming on the foreign substrate an $Al_xGa_{1-x}N$ (0<x<1) crystal layer having a principal plane of C face, an area of 2 cm$^2$ or more, and a thickness of 200 μm or more by using a HVPE method.

According to a sixth feature of the invention, in the method for fabricating a nitride-based compound semiconductor substrate, an organic Al compound is used as a source of Al.

According to a seventh feature of the invention, the method for fabricating a nitride-based compound semiconductor substrate, further comprises a step of:

separating the $Al_xGa_{1-x}N$ crystal layer grown on the foreign substrate from the foreign substrate.

According to an eighth feature of the invention, the method for fabricating a nitride-based compound semiconductor substrate, further comprises steps of:

growing the $Al_xGa_{1-x}N$ crystal layer to have a diameter of 15 mm or more and a thickness of 10 mm or more; and slicing the $Al_xGa_{1-x}N$ crystal layer.

According to a ninth feature of the invention, a method for fabricating a nitride-based compound semiconductor substrate, comprises steps of:

providing a sapphire substrate; and forming an AlGaN layer on the sapphire substrate by HVPE method by using an organic Al compound as a source of Al.

According to a tenth feature of the invention, a method for fabricating a nitride-based compound semiconductor substrate, comprises steps of:

providing a sapphire substrate;

growing a GaN layer on the sapphire substrate by a MOVPE method;

depositing a SiO$_2$ film on the GaN layer by a thermal CVD method;

opening a stripe-shaped window on the SiO$_2$ film to provide a mask by a photolithography method;

growing a AlGaN thick film on the sapphire substrate by a HVPE method by using an organic Al compound as a source of Al.

According to an eleventh feature of the invention, a method for fabricating a nitride-based compound semiconductor substrate, comprises steps of:

providing a sapphire substrate; growing an $Al_yGa_{1-y}N$ ($0 \leq y \leq 1$) layer on the sapphire substrate by a MOVPE method;

depositing a metal film on the $Al_yGa_{1-y}N$ layer by a vacuum evaporation;

heat-treating the metal film in an atmosphere containing a mixed gas of $H_2$ and $NH_3$ to provide a mesh-shaped metal nitride film on which voids are formed;

growing a AlGaN thick film on the sapphire substrate by a HVPE method by using an organic Al compound as a source of Al; and separating the AlGaN thick film from the sapphire substrate.

According to the present invention, the organic Al compound such as TMA (trimethyl aluminum) or TEA (triethyl aluminum) is used as the source of Al instead of the aluminum chloride, the stable crystal growth can be realized without damaging the reacting furnace, so that the large-sized AlGaN crystal substrate with excellent crystallinity can be provided.

BRIEF DESCRIPTION OF THE DRAWINGS

Preferred embodiment according to the invention will be described in conjunction with appended drawings, wherein.

DETAILED DESCRIPTION OF PREFERRED EMBODIMENTS

Next, a nitride-based compound semiconductor substrate and a method in preferred embodiments according to the present invention will be explained in more detail in conjunction with the appended drawings.

A nitride-based compound semiconductor substrate according to the present invention is a nitride-based compound semiconductor substrate, which is mainly used for epitaxial growth of a nitride-based compound semiconductor. A composition of the nitride-based compound semiconductor substrate is expressed as $Al_xGa_{1-x}N$ ($0<x<1$), a principal plane thereof is C face, an area of the principal plane is 2 cm$^2$ or more, and a thickness thereof is 200 μm or more. Further, a half bandwidth of X-ray rocking curve on (0002) reflection is 300 seconds or less, and a variation of Al composition in the plane is in a range of plus or minus 20% of a center value.

By using the organic Al compound such as TMA (trimethyl aluminum) or TEA (triethyl aluminum) as a source of Al, the nitride-based compound semiconductor substrate having the aforementioned structure can be fabricated by using the HVPE method without damaging the reacting furnace.

First Preferred Embodiment

FIGS. 2A to 2D are diagrams showing a method for fabricating a nitride-based compound semiconductor substrate in a first preferred embodiment according to the present invention.

Figure 1:
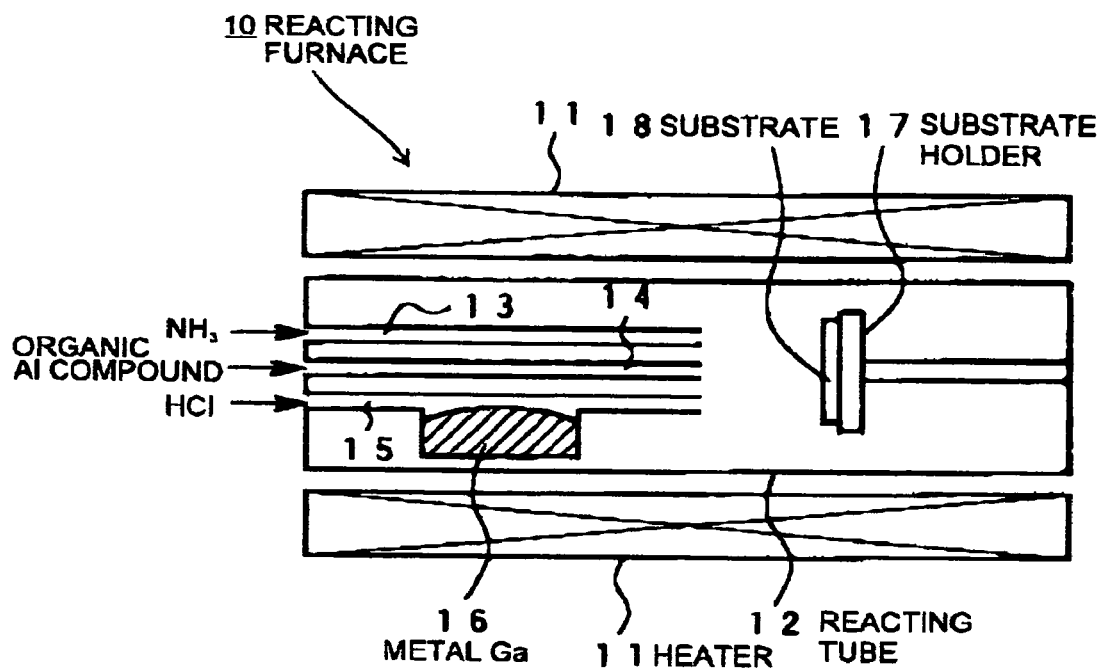
FIG. 1 is an explanatory diagram showing a reacting furnace for fabricating a nitride-based compound semiconductor substrates according to the present invention.
Figure 2A:
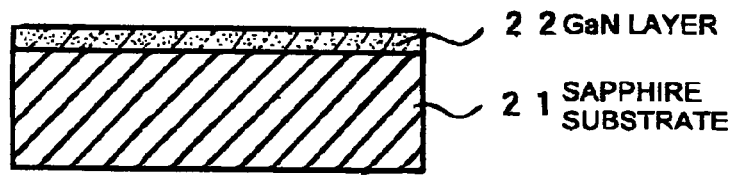
FIGS. 2A to 2D are diagrams showing a method for fabricating a nitride-based compound semiconductor substrate in a first preferred embodiment according to the present invention.
Figure 2B:
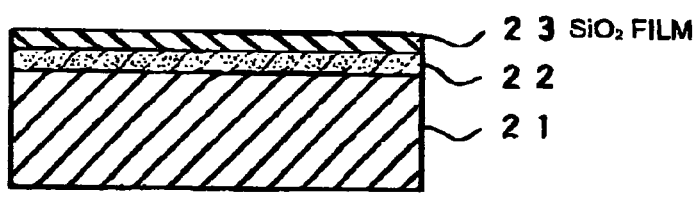
Figure 2C:
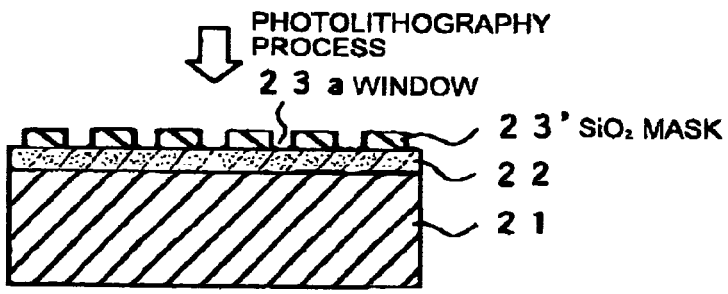
Figure 2D:
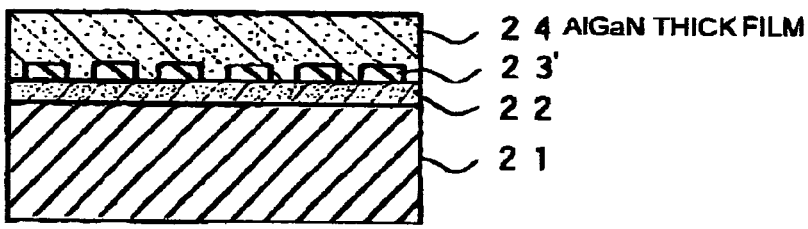

Firstly, a GaN layer 22 having a thickness of 2 μm is grown on a sapphire substrate 21 having a diameter of 2 inches (φ2") by using a metalorganic vapor phase epitaxy method (MOVPE method) as shown in FIG. 2A. On the GaN layer 22 formed on the sapphire substrate 21, a $SiO_2$ film 23 is deposited to have a thickness of 0.5 μm by using a thermal CVD method as shown in FIG. 2B. Then, stripe-shaped windows 23a are opened on the $SiO_2$ film 23 in parallel with <11-20> direction by using a photolithography method, so as to form a $SiO_2$ mask 23' as shown in FIG. 2C Each of the windows 23a has a width of 3 μm, and the $SiO_2$ mask 23' has a width of 7 μm. The sapphire substrate 21 on which the GaN layer 22 and the $SiO_2$ mask 23' are sequentially grown is set in a HVPE furnace shown in FIG. 1, and an AlGaN thick film 24 is grown thereon as shown in FIG. 2D.

B furnace 10 comprises a heater 11, a reacting tube 12, a $NH_3$ introducing tube 13, an organic Al compound introducing tube 14, a HCl introducing tube 15, and a substrate holder (susceptor) 17. A metal Ga 16 is provided in the HCl introducing tube 15 and a substrate 18 is set on the substrate holder 17. In the first preferred embodiment, the substrate 18 corresponds to the sapphire substrate 21 on which the GaN layer 22 and the $SiO_2$ mask 23' are sequentially grown.

In this reacting furnace 10, a GaCl that is a halide of a group III element and an organic Al compound such as trimethyl aluminum (TMA) are transported on the substrate 18. The GaCl is generated from a reaction of the metal Ga 16 with the HCl supplied from the HCl introducing tube 15 together with a carrier gas such as $H_2$ or $N_2$. The organic Al compound is supplied from the organic Al compound introducing tube 14 together with a carrier gas such as $H_2$ or $N_2$.

In a substrate area, while the GaCl, TMA and $NH_3$ supplied from the $NH_3$ introducing tube 13 are mixed to react with each other, the AlGaN is grown on the substrate 19 set on the substrate holder 17 by the vapor phase epitaxy. A temperature of the substrate area is set at 1100° C. in the electric reacting furnace 10 (by the heater 11). In addition, a partial pressure of GaCl, a partial pressure of TMA, and a partial pressure of $NH_3$, which are the source of AlGaN are $5 \times 10^{-3}$ atm, $5 \times 10^{-4}$ atm, and 0.3 atm, respectively, in the substrate area Under these conditions, a growth speed is 50 μm/h. A grown crystal plane is C face, and has a mirror surface and a thickness of about 500 μm.

As a result of a photoluminescence measurement, the Al composition of the $Al_xGa_{1-x}N$ is x=0.05, and the variation of Al composition is in a range of plus or minus 8%. In addition, the half bandwidth of the X-ray rocking curve on the (0002) reflection is about 210 seconds that is considered to be a good value.

Second Preferred Embodiment

FIGS. 3A to 3E are diagrams showing a method for fabricating a nitride-based compound semiconductor substrate in a second preferred embodiment according to the present invention.

In the second preferred embodiment, there is descried a method for fabricating an AlGaN self-standing substrate by using VAS (void-assisted separation) method, which is a known method in this field (e.g. JP-A-2003-178984).

Figure 3A:
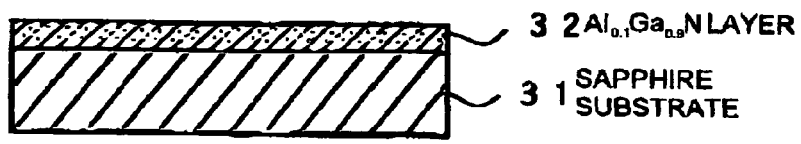
FIGS. 3A to 3E are diagrams showing a method for fabricating a nitride-based compound semiconductor substrate in a second preferred embodiment according to the present Invention.
Figure 3B:
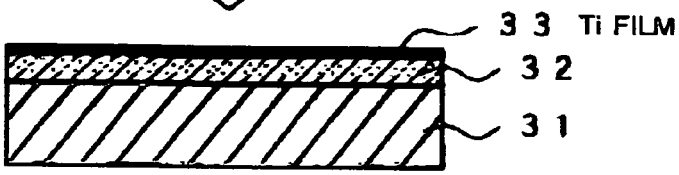
Figure 3C:

Firstly, an $Al_{0.1}Ga_{0.9}N$ layer 32 having a thickness of 0.3 µm is grown on a sapphire substrate 31 having a diameter of 2 inches (φ2") by using the metalorganic vapor phase epitaxy method (MOVPE method) as shown in FIG. 3A. Herein, AlN layer, GaN layer, etc. may be used instead of the $Al_{0.1}Ga_{0.9}N$ layer 32. Namely, the $Al_{0.1}Ga_{0.9}N$ layer 32 can be expressed as an $Al_yGa_{1-y}N$ (0≦y≦1) layer. On the sapphire substrate 31, a Ti film 33 having a thickness of 20 nm is deposited by a vacuum evaporation as shown in FIG. 3B. Thereafter, a heat treatment is conducted at a temperature of 1050° C. for 30 minutes in a flow of a mixed gas of $H_2$ and $NH_3$. As a result, the Ti film 33 is nitrided to provide a TiN film 33' Simultaneously, the TiN film 33' is aggregated and a layer structure of the Ti film 33 is changed into a mesh-shaped structure having a lot of fine holes, each having a width of about 20 to 30 nm as shown in FIG. 3C.

Figure 3D:
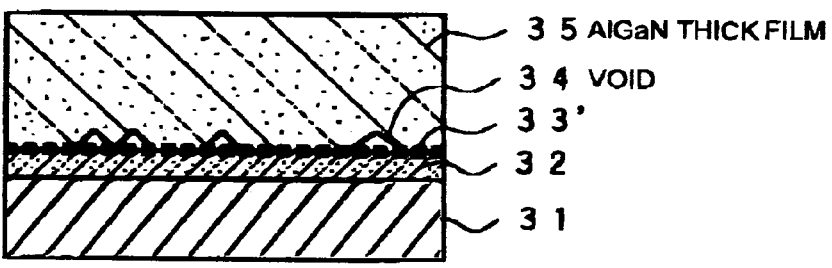

The sapphire substrate 31 on which the $Al_{0.1}Ga_{0.9}N$ layer 32 and the TiN film 33' are sequentially grown is set in a HVPE furnace shown in FIG. 1, and a thick AlGaN film 35 is grown thereon as shown in FIG. 3D. The growth is conducted similarly to that in the first preferred embodiment. However, trimethyl aluminum (TEA) is used as a source for the organic Al compound. Herein, voids 34 are generated as shown in FIG. 3D.

Figure 3E:
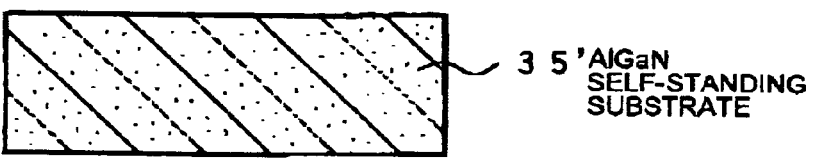

After the growth, the AlGaN thick film 35 is separated from the sapphire substrate 31 and the $Al_{0.1}Ga_{0.9}N$ layer 32 at an interface with the TiN film 33' without producing cracks, so that an AlGaN self-standing substrate 35' having a diameter of 2 inches (φ2") is obtained as shown in FIG. 3E. A grown crystal plane is C face, and has a mirror surface and a thickness of about 500 µm.

As a result of a photoluminescence measurement, the Al composition of the $Al_xGa_{1-x}N$ is x=0.1, and the variation of Al composition is in a range of plus or minus 6%. In addition, the half bandwidth of the X-ray rocking curve on the (0002) reflection is about 80 seconds that is considered to be a good value.

Other Embodiments and Variations

In the first and second preferred embodiment, the explanation is made for the AlGaN crystal and methods for fabricating the same. However, the invention is not limited thereto.

For example, an AlInGaN quaternary mixed crystal may be fabricated by flowing TMI (trimethyl indium) simultaneously with the source gas. In addition, the Al composition may be varied in the middle of the AlGaN film along a thickness direction. The Al composition may be varied in stages (for stepwise) or continuously.

(Basis for Optimum Conditions)

The optimum conditions of the present invention will be examined below.

An area of the crystal is preferably 2 $cm^2$ In general, when the epitaxial growth is conducted on the substrate, it is difficult to form a designed structure at a peripheral portion having a width of about several millimeters, since there is a turbulence of the source gas stream at an edge portion and so on. Therefore, it is necessary to provide the substrate with a large area to some extent.

A thickness of the substrate is preferably 200 µm or more. If the thickness of the substrate is less than 200 µm, the substrate may be easily broken due to a lack of strength when handling the substrate.

For the substrate, a half bandwidth of the X-ray is preferably 300 seconds or less. It is to obtain a sufficient reliability of the device to be fabricated on this substrate. Concerning the crystalline quality, the half bandwidth of the X-ray is increased in accordance with an increase of crystal defects such as a threading dislocation in the substrate crystal. The dislocation is succeeded as it is in the device that is grown on the substrate, thereby causing a deterioration of the reliability e.g. a lifetime of the device. Such a problem can be avoided by using a substrate crystal with an excellent crystallinity.

A variation in the Al composition is preferably less than a range of plus or minus 20% in the crystal plane. The first reason is to suppress a variation of optical characteristics. For example, when an ultraviolet light emitting diode is fabricated by using this substrate, a variation of brightness in every chip becomes large, since a part having a reduced Al composition absorbs the ultraviolet light so that the brightness falls.

The second reason is to obtain a sufficient uniformity in the crystallinity of the epitaxial layer formed on this substrate. In other words, since the lattice constant of the $Al_xGa_{1-x}N$ is varied in accordance with the change in the Al composition, a lattice mismatch is increased in a region where the Al composition is shifted, so that a generation of a new dislocation becomes remarkable.

The third reason is to obtain a sufficient uniformity in electric characteristics. Since the electric characteristics of the $Al_xGa_{1-x}N$ is varied in accordance with the change in the Al composition, a variation in the electric characteristics for every chip is increased when the variation in the Al composition is large.

Further, the crystal preferably has a diameter of 15 mm or more and a length of 10 mm or more. It is to cut a sufficient number of pieces of the substrate that is worth a fabrication cost while keeping a margin for handling, when the crystal is sliced.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A nitride-based compound semiconductor self-standing substrate, consisting of:
   an $Al_xGa_{1-x}N$ (0<x<1) crystal layer having a principal plane of C face that is a mirror surface, an area of 2 $cm^2$ or more, and a thickness of 200 µm or more,
   wherein a half bandwidth of an X-ray rocking curve on a (0002) reflection is 300 seconds or less, and
   wherein a variation in an Al composition is within a range of plus or minus 20% of a center value in a plane.

* * * * *